United States Patent [19]

Okamoto et al.

[11] Patent Number: 5,757,340
[45] Date of Patent: May 26, 1998

[54] AMPLIFIER WITH A SECOND ACTIVE ELEMENT BEING CASCODE CONNECTED TO A FIRST ACTIVE ELEMENT AND HAVING A CONTROL ELECTRODE CONNECTED TO A CONSTANT VOLTAGE

[75] Inventors: Nobuyuki Okamoto, Tokyo; Haruhisa Iida, Chiba, both of Japan

[73] Assignee: Sony Corporation, Tokyo, Japan

[21] Appl. No.: 580,518

[22] Filed: Dec. 28, 1995

[30] Foreign Application Priority Data

Jan. 19, 1995 [JP] Japan ................. 7-006091

[51] Int. Cl.⁶ .................. G09G 5/00; H03F 1/08; H04N 5/217
[52] U.S. Cl. .................. 345/22; 345/204; 348/708; 330/291; 330/310
[58] Field of Search ........... 345/204; 330/75, 330/76, 78, 84, 85, 109, 144, 143, 250, 291, 292, 310, 255; 348/241, 655, 250, 379, 600, 713, 708; 382/275; 315/386

[56] References Cited

U.S. PATENT DOCUMENTS

| | | | |
|---|---|---|---|
| 3,732,356 | 5/1973 | Matzek | 348/713 |
| 4,354,202 | 10/1982 | Harlan | 348/600 |
| 4,577,234 | 3/1986 | Harlan | 348/379 |
| 4,825,292 | 4/1989 | Knibbe | 348/250 |
| 5,089,754 | 2/1992 | George | 315/386 |
| 5,515,005 | 5/1996 | Yoshioka | 330/255 |

Primary Examiner—Steven Saras
Assistant Examiner—Seth D. Vail
Attorney, Agent, or Firm—Jay H. Maioli

[57] ABSTRACT

An amplifier circuit in a display device for a monitor unit in a computer system or the like, includes first active element whose control electrode is supplied with a signal from an input terminal; a second active element cascade-connected to the first active element; a third active element so connected to the second active element that a junction thereof is connected to an output terminal; an impedance element disposed between the input terminal and the third active element and capable of changing the impedance in accordance with the frequency of the input signal; a first resistance element connected between the junction of the second and third active elements and the control electrode of the first active element; and a second resistance element connected between the input terminal and the control electrode of the first active element and serving to determine the signal amplification factor in cooperation with the first resistance element. Since the second active element is cascade-connected to the first active element, no manipulation is necessary for adjusting the component elements, and generation of any smear or sag resulting from variation of the feedback capacitance can be suppressed at low cost.

7 Claims, 9 Drawing Sheets

F I G. 6
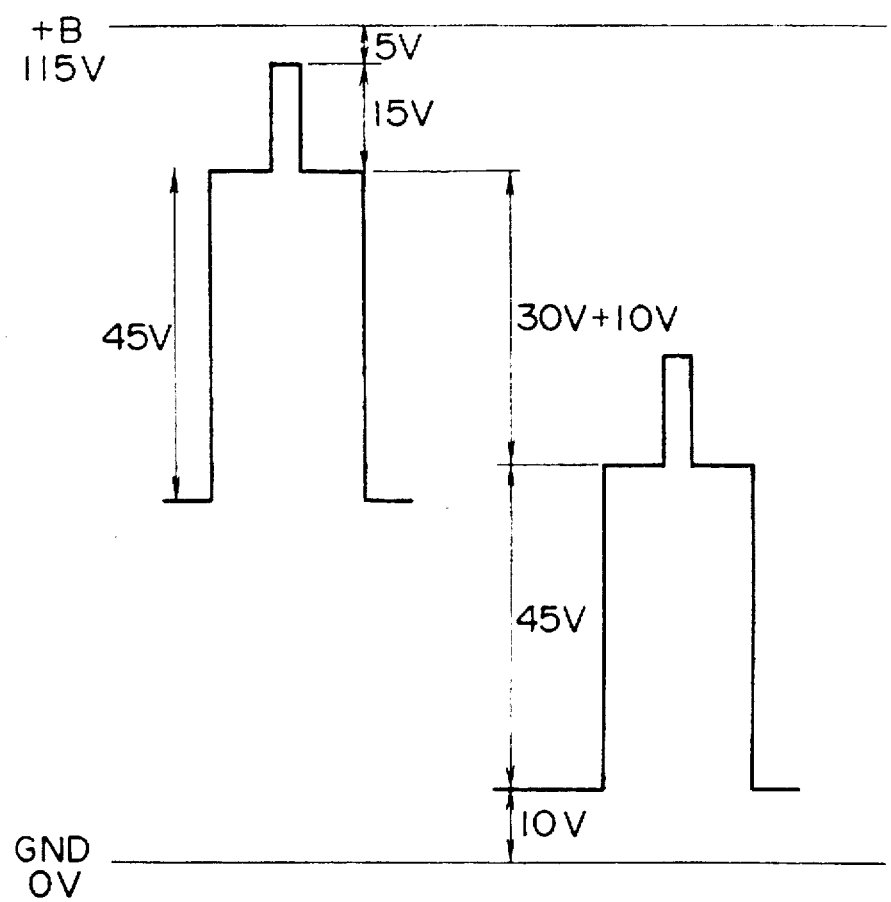

AMPLIFIER WITH A SECOND ACTIVE ELEMENT BEING CASCODE CONNECTED TO A FIRST ACTIVE ELEMENT AND HAVING A CONTROL ELECTRODE CONNECTED TO A CONSTANT VOLTAGE

BACKGROUND OF THE INVENTION

1. Field of the Invention

The present invention relates to an amplifier circuit and a display device and, more particularly, to those adapted for use in a monitor unit employed in a computer system for example.

2. Description of the Related Art

FIG. 3 shows an exemplary configuration of a conventional amplifier circuit known heretofore. A signal input terminal 30 is connected to a base of an NPN transistor 34 via a series circuit consisting of a capacitor 31 and a resistor 32 which are connected in series to each other. And a resistor 33 is connected in parallel to the series circuit of the capacitor 31 and the resistor 32. The base of the NPN transistor 34 is grounded via a resistor 35 while being connected via a capacitor 43 to a base of a PNP transistor 40.

An emitter of the NPN transistor 34 is grounded via a resistor 36 while being grounded also via a series circuit of a resistor 37 and a capacitor 38. And a collector of the NPN transistor 34 is connected via a resistor 39 to a collector of the PNP transistor 40.

A base of the PNP transistor 40 is grounded via a resistor 42 while being connected via a resistor 41 to a predetermined voltage source +B. And an emitter of the PNP transistor 40 is connected via a resistor 44 to the voltage source +B while being connected thereto via a series circuit of a resistor 45 and a capacitor 46 as well. The voltage source +B is grounded via a capacitor 47.

The collector of the NPN transistor 34 is connected to a base of a PNP transistor 48. A collector of the PNP transistor 48 is grounded, and an emitter thereof is connected via a resistor 49 to a signal output terminal 53. This output terminal 53 is connected via a resistor 50 to an emitter of an NPN transistor 51. A base of the NPN transistor 51 is connected via the resistor 39 to the collector of the NPN transistor 34, and a collector thereof is connected to the voltage source +B. Consequently, the PNP transistor 48 and the NPN transistor 51 are in push-pull connection.

Further the signal output terminal 53 is connected via a resistor 52 to the base of the NPN transistor 34. As denoted by a broken line in FIG. 3, a load capacitance 54 is connected equivalently to the output terminal 53.

Now the operation of the above amplifier circuit will be described below. A signal inputted from the signal input terminal 30 is supplied via the capacitor 31 and the resistor 32 to the base of the NPN transistor 34. When the frequency of the input signal fed to the signal input terminal 30 is relatively low, the impedance of the capacitor 43 is rendered relatively high. Therefore the signal is substantially not applied to the base of the PNP transistor 40. Consequently, the base potential of the PNP transistor 40 is fixed at the value obtained through division of the voltage of the voltage source +B by the resistors 41 and 42, and the PNP transistor 40 functions as a constant current source, so that a constant current outputted from the collector of the PNP transistor 40 is caused to flow between the collector and emitter of the NPN transistor 34 via the resistor 39.

Since the signal is inputted to the base of the NPN transistor 34, the collector voltage of the NPN transistor 34 is changed in an opposite-phase relationship to the signal. The NPN transistor 51 operates in response to an increase of the collector voltage of the NPN transistor 34, thereby raising the voltage at the signal output terminal 53.

In contrast with the above, the PNP transistor 48 operates in response to a decrease of the collector voltage of the NPN transistor 34, thereby lowering the voltage at the signal output terminal 53. In this manner, the signal at the signal output terminal 53 relative to the signal input terminal 30 is amplified in an opposite-phase relationship and then is delivered from the signal output terminal 53.

Meanwhile when the frequency of the input signal fed to the signal input terminal 30 is relatively high, the impedance of the capacitor 43 is rendered relatively low. Therefore the base voltage of the PNP transistor 40 is changed in accordance with the signal, so that the current outputted from the PNP transistor 40 contains a component corresponding to the input signal. Consequently, there is attained an improvement particularly with regard to the rise time of the signal in a higher frequency region.

Since the amplifier circuit shown in FIG. 3 is an active load type (where the load of the NPN transistor 34 is the PNP transistor 40), it is possible to achieve enhancement in the frequency characteristic, rise time and fall time in comparison with those of a resistance load type (where a resistor is connected to a load) when the power consumption is the same in both types.

In an operation where red (R), green (G) and blue (B) color signals outputted from an unshown computer are amplified respectively by the amplifier circuit shown in FIG. 3 and are supplied directly to unshown CRTs so that an image outputted from the computer is displayed on the CRTs, it is necessary to perform white balance control in each of the CRTs. For this reason, signals having adequate amplitudes and offset voltages corresponding to variations in the individual CRTs need to be applied to the R, G and B cathodes of the CRTs.

Assume for example that, in one monitor unit, an offset voltage of 100V with an amplitude of $40V_{p-p}$ is applied to the R cathode of its CRT, an offset voltage of 98V with $42V_{p-p}$ to the G cathode and an offset voltage of 99V with $38V_{p-p}$ to the B cathode respectively; while in the other monitor unit, an offset voltage of 102V with an amplitude of $39V_{p-p}$ is applied to the R cathode of its CRT, an offset voltage of 101V with $40V_{p-p}$ to the G cathode, and an offset voltage of 105V with $37V_{p-p}$ to the B cathode, respectively. In this manner, both the amplitude and the offset voltage need to be controlled for each CRT (of each monitor unit).

Here, an offset voltage signifies a DC potential from a reference voltage +B to a pedestal, as shown in FIGS. 4 and 5 for example. Meanwhile an amplitude voltage $V_{p-p}$ signifies a potential from a pedestal to a peak. FIG. 4 shows a case where the offset voltage is higher than that in the example of FIG. 5.

FIG. 6 shows an exemplary case where the maximum output amplitude ($V_{p-p}$) of the amplifier circuit is set to 45v, the level for blanking is set to 15V, the offset voltage changeable amount for white balance control is set to 30V, the brightness changeable amount for picture brightness control is set to 10V, the margin on the voltage source side to 5V, and the margin on the ground (GND) side is set to 10V, respectively. Then the value of the voltage source +B amounts to a total of 115 (=45+15+30+10+5+10) V.

However, in the known circuit of FIG. 3 which is currently available as a practical product as a of hybrid IC, the withstand voltage of each transistor is 90V or so in general, so that the value of the voltage source +B in the amplifier circuit of FIG. 3 is not settable to 115V shown in FIG. 6.

Assuming that transistors of a high withstand voltage (e.g., 120V or 140V) are employed in the circuit of FIG. 3, it may be possible to achieve improvements as shown in FIGS. 7 and 8 where the output of a voltage source +B is 140V and the offset voltage is rendered adjustable in a wider range.

However, if transistors of a high withstand voltage are used in the example of FIG. 3, there may occur a disadvantage that, when the level of a video signal to be amplified is changed sharply and frequently between black and white, the impedance of the load capacitance 54 is lowered since the signal frequency is high, so that the load capacitance 54 is charged and discharged by the NPN transistor 51 and the PNP transistor 48, and therefore the current flowing in the NPN transistor 51 and the PNP transistor 48 becomes extremely great to consequently cause a fault that the power consumption exceeds a proper practical range.

For this reason, in any actual circuit configuration, the example of FIG. 3 is used in a state where the offset voltage is not changed.

Under the circumstances mentioned above, there arise some requirements of rendering the offset voltage changeable, lowering the production cost and further reducing the power consumption. FIG. 9 shows an amplifier circuit proposed in an attempt to meet such requirements. In the example of FIG. 9, the push-pull connected NPN transistor 51 and PNP transistor 48 in the configuration of FIG. 3 are omitted. Consequently, the resistors 39, 49 and 50 are also omitted. In FIG. 9, a signal output terminal 53 is connected to a junction of the collector of a PNP transistor 40 and an NPN transistor 34, and this junction is connected via a resistor 52 to the base of the NPN transistor 34.

In this example, a resistor 71 is connected between a capacitor 43 and the base of the PNP transistor 40, and one end of the capacitor 43 is connected directly to a signal input terminal 30. Further in this example, a resistor 73 is connected to the base of the NPN transistor 34, and a voltage for setting the offset potential of the signal output terminal 53 is applied from a terminal 72.

The other circuit configuration is the same as that in FIG. 3.

In the example of FIG. 9, the production cost can be lowered and the power consumption can be reduced correspondingly by omission of the NPN transistor 51, the PNP transistor 48 and the resistors 39, 49 and 50. It is further possible to control the offset potential of the signal output terminal 53 by adjusting the voltage applied from the terminal 72.

However, in the example of FIG. 9, there exists a problem that defects of smear and sag are prone to be generated due to variations of the load capacitance 54 and the feedback capacitance $C_{re}$ ($C_{ob}$) of the NPN transistor 34 and the PNP transistor 40.

More specifically, in the example of FIG. 9, the signal component appearing at the output terminal 53 is fed back to the base of the NPN transistor 34 or to the base of the PNP transistor 40 because of the feedback capacitance $C_{re}$ ($C_{ob}$). As a result, when the video signal is sharply changed as illustrated in FIG. 10, there occurs a defect of smear where such change induces a blunt waveform. Meanwhile, when the level is sharply changed as illustrated in FIG. 11, there occurs another defect of sag where the level is emphasized as compared with the original level.

Upon generation of some smear in case a white band image of a predetermined width extending horizontally is displayed as shown in FIG. 12 for example, the video signal at a position denoted by a straight line L in FIG. 12 is turned to be such as shown in FIG. 10. Therefore, as shown in FIG. 12, a portion blacker than the original color is generated in the vicinity of, e.g., the left end of the white band, and a portion whiter than the original color is generated in the vicinity of the right end thereof.

Meanwhile, upon generation of some sag, the video signal on a horizontal scanning line at the position of a straight line L shown in FIG. 13 is turned to be such as shown in FIG. 11, so that a portion whiter than the original color is generated in the vicinity of the left end of the white band, and a portion blacker than the original color is generated in the vicinity of the right end.

Generation of any smear and sag resulting from the feedback capacitance of the NPN transistor 34 can be suppressed by selectively setting, in a stage of designing the circuit configuration, the values of the capacitor 31 and the resistor 32 and the values of the capacitor 38 and the resistor 37 to proper ones respectively. Similarly, generation of any smear and sag resulting from the feedback capacitance of the PNP transistor 40 can be suppressed by selectively setting the values of the capacitor 43 and the resistor 71 and the values of the capacitor 46 and the resistor 45 to proper ones respectively.

Practically, however, variation is existent in each of the NPN transistor 34 and the PNP transistor 40, so that the feedback capacitance thereof is also varied. Consequently, even if a specific NPN transistor 34 and a specific PNP transistor 40 are selected and the values of individual capacitors and resistors are experimentally determined to suppress generation of smear and sag that result from the feedback capacitance of each transistor, an NPN transistor 34 and a PNP transistor 40 employed in any other monitor unit are different from those used in the experiment, whereby the values of capacitors and resistors, if set to be equal to those obtained experimentally, fail to coincide with the proper values adequate for suppressing generation of smear and sag.

It is a matter of course that any smear and sag resulting from the feedback capacitance of each of the NPN transistor 34 and the PNP transistor 40 can be suppressed by employing variable capacitors and resistors of adjustable type and adjusting the values of such capacitors and resistors in each of monitor units individually. In this configuration, however, an operation for the adjustment needs to be performed in manufacturing the monitor units one by one to eventually bring about increase of the production cost.

SUMMARY OF THE INVENTION

It is therefore an object of the present invention to suppress generation of any smear and sag that result from the feedback capacitance of each transistor, without the necessity of individually adjusting the values of component elements.

According to one aspect of the present invention, there is provided an amplifier circuit which comprises a first active element whose control electrode is supplied with an input signal fed from a signal input terminal; a second active element cascade-connected to the first active element; a third active element connected to the second active element in such a manner that a junction thereof to the second active element is connected to a signal output terminal; an impedance element disposed between the signal input terminal and the third active element and capable of changing the impedance value in accordance with the frequency of the input signal fed from the signal input terminal; a first resistance element connected between the junction of the second and third active elements and the control electrode of the first active element; and a second resistance element connected between the signal input terminal and the control electrode of the first active element and serving to determine the signal amplification factor in cooperation with the first resistance element.

In the amplifier circuit, the impedance element is a capacitance element, and when the frequency of the signal fed from the the signal input terminal is high, the capacitance element supplies the signal to the control electrode of the third active element, but when the frequency of the signal is low, the capacitance element does not supply the signal substantially to the control electrode of the third active element and enables the third active element to function as a current source to the second active element. In this configuration, a constant voltage is applied to the control electrode of the second active element.

The amplifier circuit further comprises a third resistance element connected to the control electrode of the first active element, wherein a predetermined voltage to decide the offset potential of the signal output terminal is applied to the third resistance element.

The amplifier circuit further comprises a fourth resistance element connected in series to the impedance element; a first series circuit of a capacitance element and a resistance element connected in series to each other while being connected in parallel to the second resistance element; a second series circuit of a capacitance element and a resistance element connected in series between the first active element and a predetermined reference potential; and a third series circuit of a capacitance element and a resistance element connected in series between the third active element and the predetermined reference potential.

According to a second aspect of the present invention, there is provided a display device comprising amplifier circuits for amplifying red (R), green (G) and blue (B) color signals respectively, and a cathode-ray tube (CRT) where the R, G and B color signals amplified by the amplifier circuits are inputted directly to corresponding cathodes of the CRT. In this display device, each of the above amplifier circuits comprises a first active element whose control electrode is supplied with an input signal fed from a signal input terminal; a second active element cascade-connected to the first active element; a third active element connected to the second active element in such a manner that a junction thereof to the second active element is connected to a signal output terminal; an impedance element disposed between the signal input terminal and the third active element and capable of changing the impedance value in accordance with the frequency of the input signal fed from the signal input terminal; a first resistance element connected between the junction of the second and third active elements and the control electrode of the first active element; and a second resistance element connected between the signal input terminal and the control electrode of the first active element and serving to determine the signal amplification factor in cooperation with the first resistance element.

In the amplifier circuit of the display device, the impedance element is a capacitance element, and when the frequency of the signal fed from the the signal input terminal is high, the capacitance element supplies the signal to the control electrode of the third active element, but when the frequency of the signal is low, the capacitance element does not supply the signal substantially to the control electrode of the third active element and enables the third active element to function as a current source to the second active element.

In the display device, the amplifier circuit further comprises a fourth resistance element connected in series to the impedance element; a first series circuit of a capacitance element and a resistance element connected in series to each other while being connected in parallel to the second resistance element; a second series circuit of a capacitance element and a resistance element connected in series between the first active element and a predetermined reference potential; and a third series circuit of a capacitance element and a resistance element connected in series between the third active element and the predetermined reference potential.

In the amplifier circuit and the display device mentioned, the second active element is cascade-connected to the first active element, and the signal output terminal is connected to the junction of the third and second active elements. Consequently, none of signal component appears at the junction of the first and second active elements, so that generation of smear or sag can be suppressed despite the existence of any feedback capacitance in the first active element.

The above and other features and advantages of the present invention will become apparent from the following description which will be given with reference to the illustrative accompanying drawings.

BRIEF DESCRIPTION OF THE DRAWINGS

FIG. 6 is an explanatory diagram illustrating how to determine the value of a voltage source in an amplifier circuit;

DESCRIPTION OF THE PREFERRED EMBODIMENTS

Figure 1:
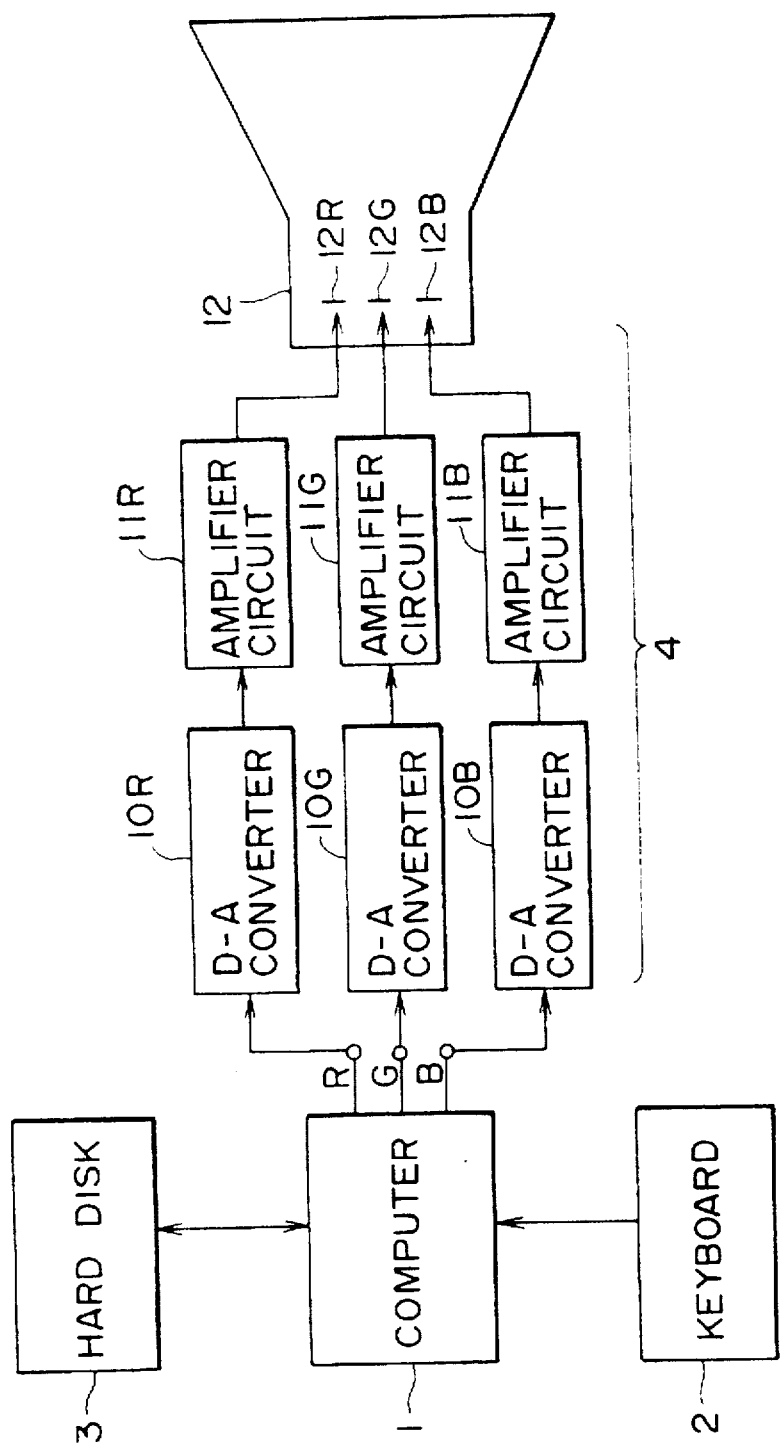
FIG. 1 is a block diagram showing an exemplary use of a monitor unit where the display device of the present invention is applied.

FIG. 1 shows a structural example of a monitor unit where the display device of the present invention is applied. In this embodiment, red (R), green (G) and blue (B) color signals obtained from a computer 1 are inputted to a monitor unit 4. The R, G, B color signals outputted from the computer 1 are supplied respectively to D-A converters 10R, 10G, 10B where digital-to-analog conversion is executed, and the converted signals are supplied respectively to corresponding amplifier circuits 11R, 11G, 11B. Subsequently the R, G, B color signals amplified in the amplifier circuits 11R, 11G, 11B are supplied directly to red, green and blue cathodes 12R, 12G, 12B of a CRT 12. In this embodiment, signal output terminals of the amplifier circuits 11R, 11G, 11B are DC-coupled to the cathodes 12R, 12G, 12B of the CRT 12.

The configuration is so formed that a desired command can be inputted to the computer 1 by manipulating a keyboard 2. The computer 1 is capable of driving a hard disk 3 in such a manner as to store any required data or program therein and to read out the same therefrom whenever necessary.

Figure 2:
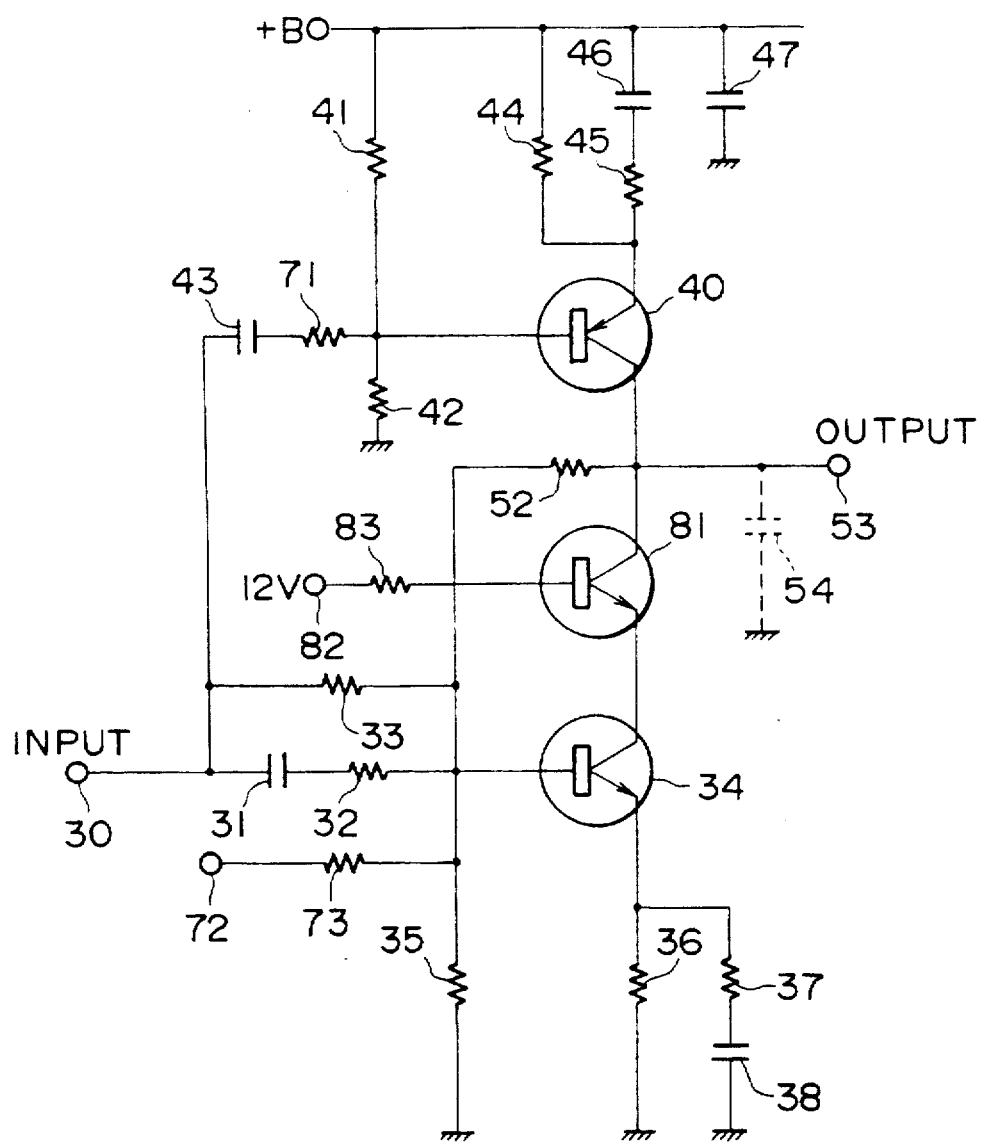
FIG. 2 is a circuit diagram showing an exemplary configuration of an amplifier circuit 11R employed in FIG. 1.
Figure 3:
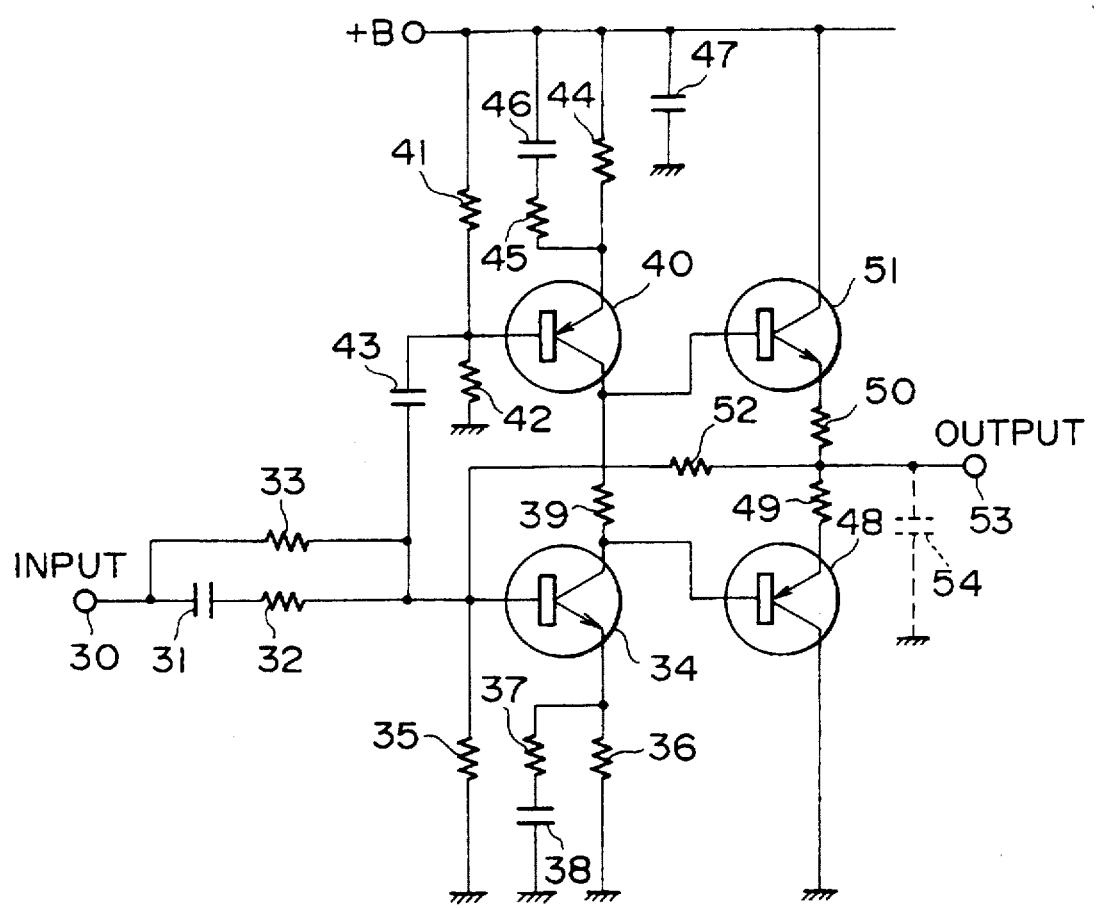
FIG. 3 is a circuit diagram showing an exemplary configuration of a conventional amplifier circuit in the prior art.
Figure 4:
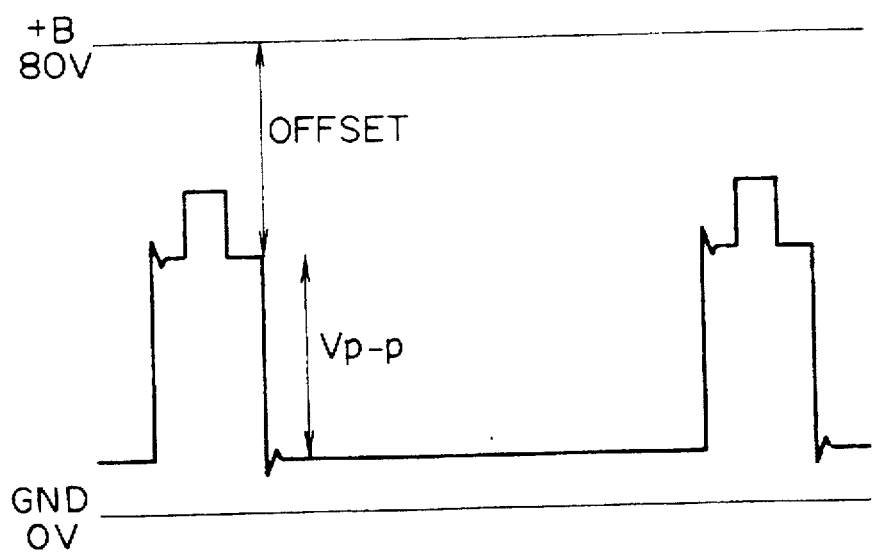
FIG. 4 is a schematic diagram for explaining an offset voltage.
Figure 5:
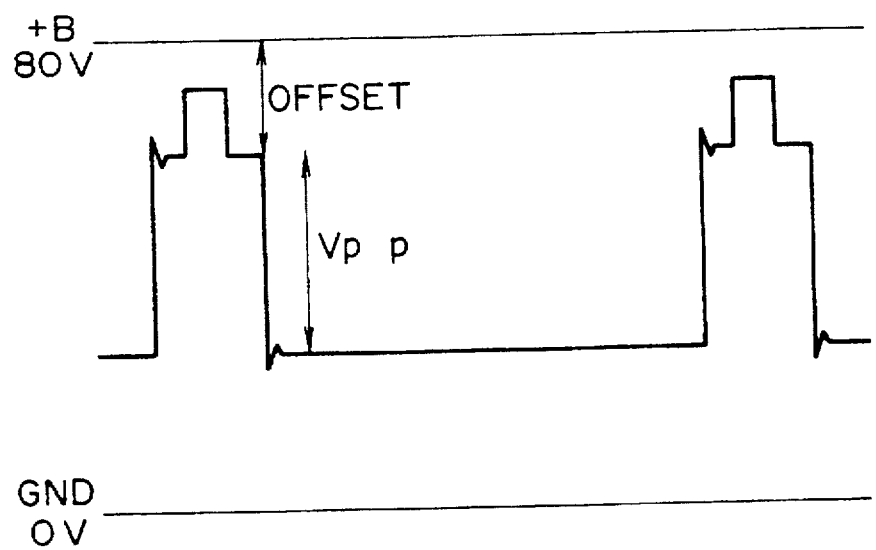
FIG. 5 is another schematic diagram for explaining a different offset voltage.
Figure 7:
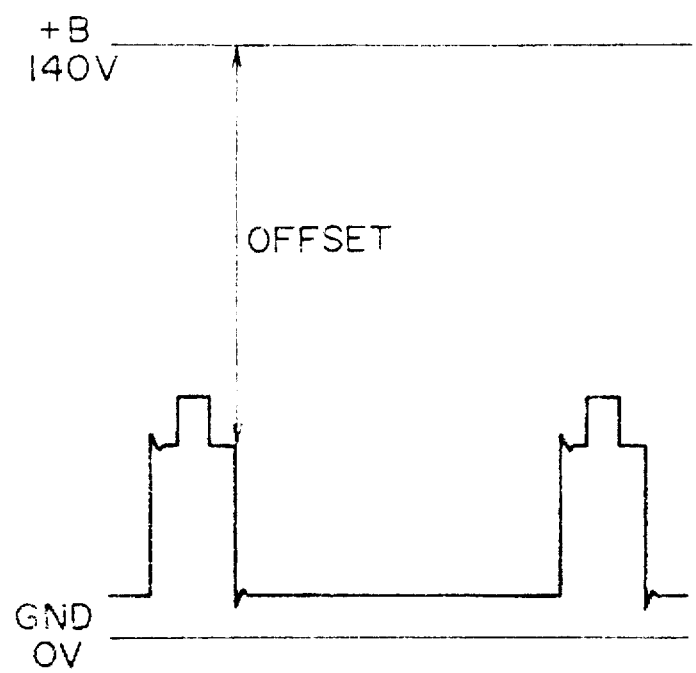
FIG. 7 is a schematic diagram for explaining an offset voltage.
Figure 8:
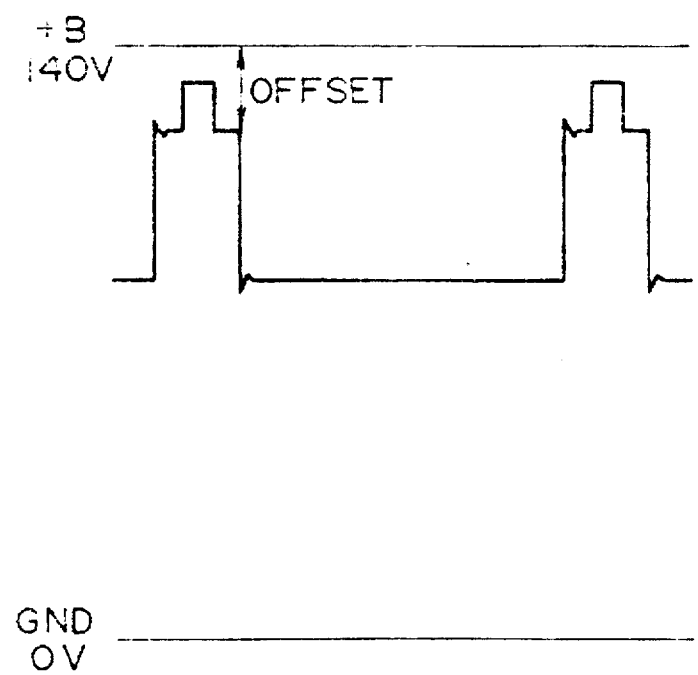
FIG. 8 is another schematic diagram for explaining a different offset voltage.
Figure 9:
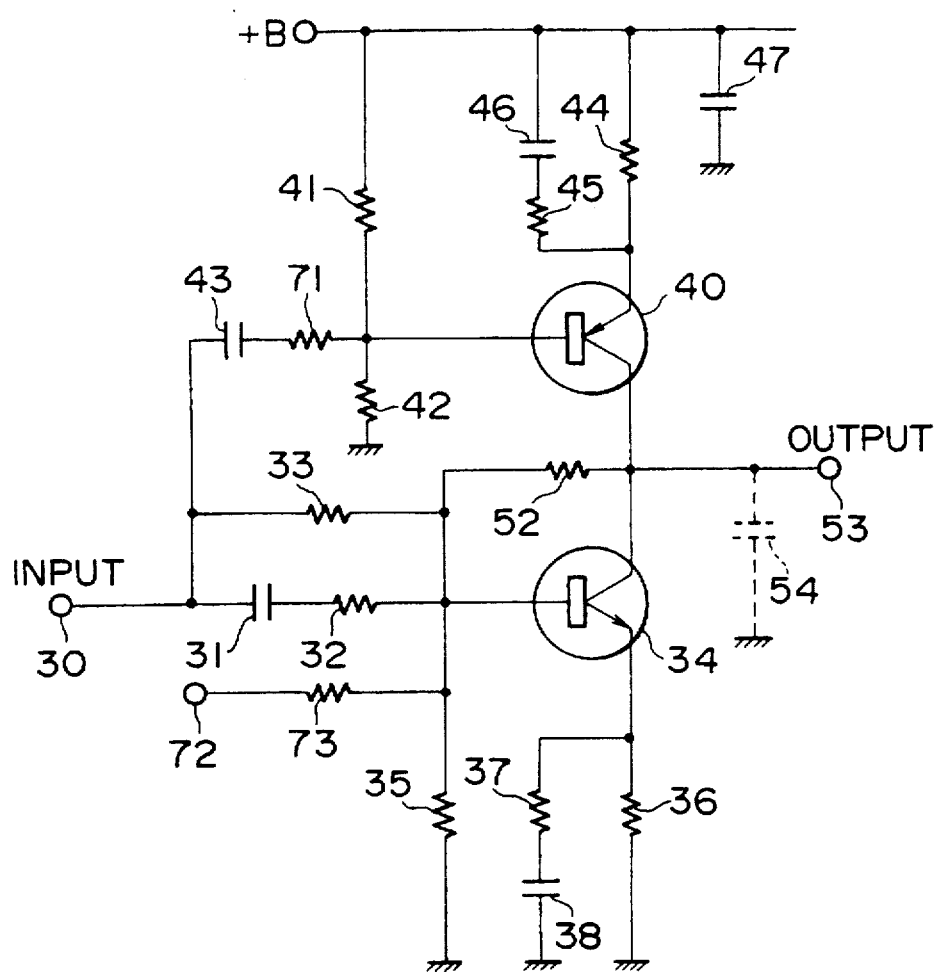
FIG. 9 is a circuit diagram showing another exemplary configuration of a conventional amplifier circuit in the prior art.
Figure 10:
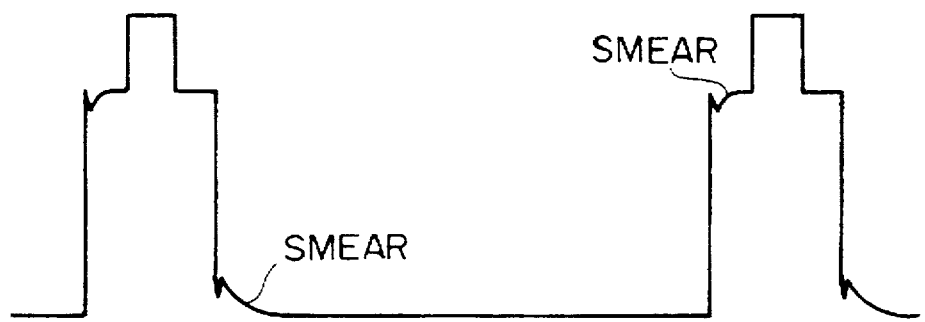
FIG. 10 is a waveform chart of signal including some smear.
Figure 11:
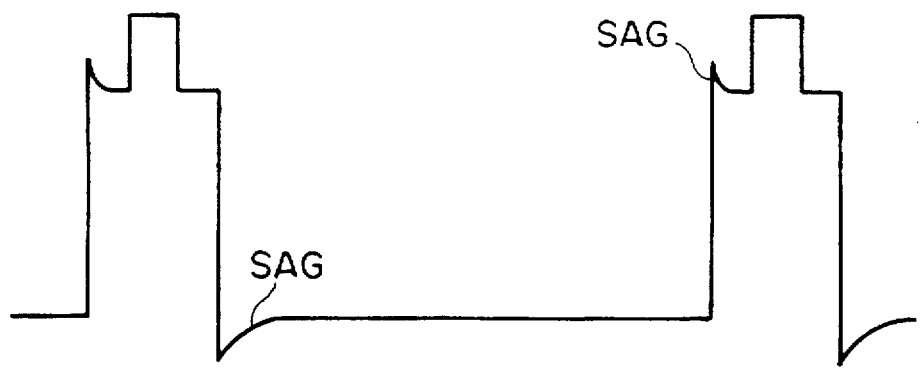
FIG. 11 is a waveform chart of signal including some sag.
Figure 12:
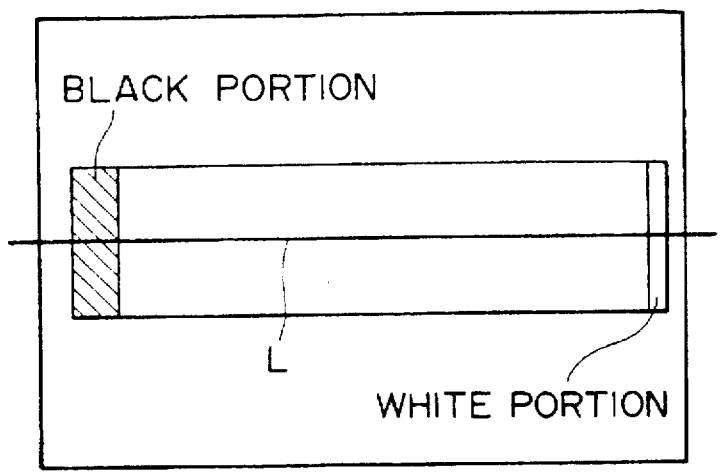
FIG. 12 illustrates an image state with smear displayed on a screen.
Figure 13:
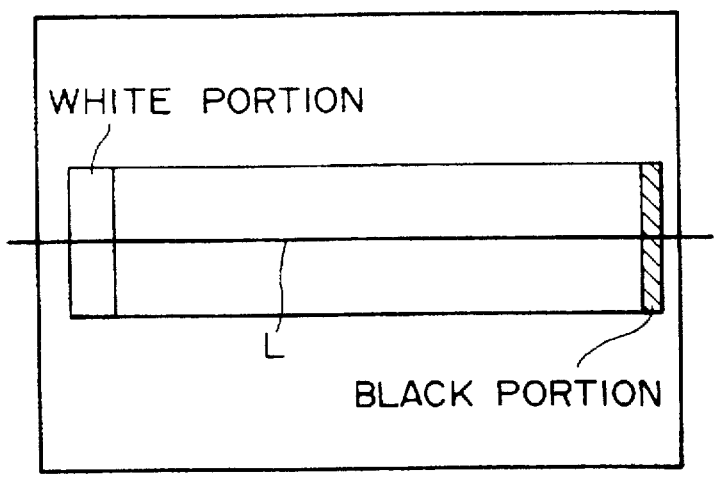
FIG. 13 illustrates another image state with sag displayed on a screen.

FIG. 2 shows a structural example of the amplifier circuit 11R, wherein any component elements corresponding to those in FIG. 9 are denoted by like reference numerals. (The other amplifier circuits 11G and 11B are structurally the same as shown in FIG. 2.) Fundamentally this embodiment is similar in structure to the amplifier circuit of FIG. 9, wherein an input signal fed from a signal input terminal 30 is supplied via a capacitor 31 and a resistor 32 to a base of an NPN transistor 34 while being supplied also to a base of a PNP transistor 40 via a capacitor 43 (impedance element) and a resistor 71. And similarly to the aforementioned example of FIG. 9, resistors or capacitors are connected to the emitters, collectors and bases of the NPN transistor 34 and the PNP transistor 40, respectively.

In the embodiment of FIG. 2, an emitter of an NPN transistor 81 is connected to the collector of the NPN transistor 34, and the collector of the PNP transistor 40 is connected to the collector of the NPN transistor 81. In other words, the NPN transistor 81 is cascade-connected to the NPN transistor 34, and this cascade amplifier serves as an active load type which drives the PNP transistor 40 as a load.

A constant voltage (12V in this embodiment) is applied from a terminal 82 via a resistor 83 to the base of the NPN transistor 81. A signal output terminal 53 is connected to a junction of the collectors of the NPN transistor 81 and the PNP transistor 40, and this junction is connected via a resistor 52 to the base of the NPN transistor 34. The other structure is the same as that in FIG. 9.

Hereinafter the operation of the above amplifier circuit will be described. The digital R, G, B color signals outputted from the computer 1 are converted into analog signals in the D-A converters 10R, 10G, 10B respectively, and the converted signals are inputted to the amplifier circuits 11R, 11G, 11B. Subsequently the color signals amplified in the amplifier circuits 11R, 11G, 11B are supplied directly to the cathodes 12R, 12G, 12B of the CRT 12, whereby the image outputted from the computer 1 is displayed on the CRT 12.

In the amplifier circuit 11R, the signal outputted from the D-A converter 10R is fed to the signal input terminal 30. This signal is supplied to the base of the NPN transistor 34 via the capacitor 31 and the resistor 32 while being supplied also to the base of the PNP transistor 40 via the capacitor 43 and the resistor 71.

When the frequency of the signal fed to the signal input terminal 30 is relatively low, the impedance of the capacitor 43 is rendered high, so that the signal component is not supplied substantially to the base of the PNP transistor 40. As a result, a fixed voltage obtained by dividing the output of the voltage source +B through the resistors 41 and 42 is supplied to the base of the PNP transistor 40, which is thereby enabled to function as a constant current source.

Then the constant current outputted from the collector of the PNP transistor 40 is supplied to a cascade amplifier consisting of the NPN transistor 81 and the NPN transistor 34. Consequently, a signal inverted and amplified by the NPN transistor 34 and the NPN transistor 81 is delivered from the signal output terminal 53.

Meanwhile, when the frequency of the signal fed to the signal input terminal 30 is relatively high, the impedance of the capacitor 43 is rendered low, so that the signal component is supplied to the base of the PNP transistor 40 via the capacitor 43 and the resistor 71. Consequently a current corresponding to the signal component is outputted from the collector of the PNP transistor 40, whereby the rise time of the output signal is shortened in particular. (The rise time of the output signal is prescribed by the NPN transistors 81 and 34.) The signal obtained from the signal output terminal 53 is supplied directly to the cathode 12R of the CRT 12 without being passed via a capacitor.

The same operation as the above is performed in the amplifier circuits 11G and 11B as well.

The values of the capacitor 31 and the resistor 32 and those of the capacitor 38 and the resistor 37 are set to adequate values determined experimentally so as to suppress generation of any smear and sag that result from the feedback capacitance $C_{re}$ ($C_{ob}$) of the NPN transistors 34 and 81. Similarly, the values of the capacitor 43 and the resistor 71 and those of the capacitor 46 and the resistor 45, are set to adequate values determined experimentally so as to suppress generation of any smear and sag that result from the feedback capacitance $C_{re}$ ($C_{ob}$) of the PNP transistor 40.

Consequently, in case there exists no variation in the feedback capacitances $C_{re}$ ($C_{ob}$) of the NPN transistors 34, 81 and the PNP transistor 40, it becomes possible to achieve complete suppression of any smear and sag that result from such feedback capacitances.

As described, however, some variations exist practically in the feedback capacitances $C_{re}$ ($C_{ob}$). Accordingly, in this embodiment, the NPN transistor 81 is cascade-connected to the NPN transistor 34, and therefore none of the signal component appears at the collector of the NPN transistor 34, so that any smear and sag resulting from the feedback capacitance $C_{re}$ ($C_{ob}$) of the NPN transistor 34 are not generated in principle. Consequently, it becomes possible to suppress generation of any smear and sag of the output signal more effectively than in the aforementioned case of FIG. 9.

It is to be noted that, in place of the NPN and PNP transistors employed as active elements in the above embodiment, FETs or some other active elements are also usable.

Furthermore, the application of this amplifier circuit is not restricted only to a monitor unit for a computer, but also to a monitor unit for displaying ordinary television broadcast pictures or to a display device of a television receiver as well.

As described above, in the amplifier circuit and the display device of the present invention where a second active element is cascade-connected to a first active element, no manipulation is necessary for adjusting the component elements, and generation of any smear or sag resulting from variation of the feedback capacitance can be suppressed at low cost, thereby achieving mass production with uniform quality. Furthermore, due to the configuration of an active load type, it is possible to enhance the frequency characteristic, rise time, fall time and so forth in comparison with a resistance load type, hence realizing superior advantages of a higher withstand voltage and less power consumption in comparison with the conventional active load type.

Although the present invention has been described hereinabove with reference to some preferred embodiments thereof, it is to be understood that the invention is not limited to such embodiments alone, and a variety of other modifications and variations will be apparent to those skilled in the art without departing from the spirit of the invention.

The scope of the invention, therefore, is to be determined solely by the appended claims.

What is claimed is:

1. An amplifier circuit comprising:

a first active element whose control electrode is supplied with an input signal feed in at an input signal terminal;

a second active element cascade-connected to said first active element and having a control electrode connected to a predetermined constant voltage;

a third active element connected to said second active element so that a junction between said second active element and said third active element forms a signal output terminal;

an impedance element connected between said input signal terminal and said third active element wherein an impedance value thereof is changed in accordance with a frequency of the input signal fed in at said input signal terminal;

a first resistance element connected between the junction between said second and third active elements and the control electrode of said first active element; and a second resistance element connected between said input signal terminal and the control electrode of said first active element, and serving to determine a signal amplification factor of the amplifier circuit in cooperation with said first resistance element.

2. The amplifier circuit according to claim 1, wherein said impedance element is a capacitance element, and when the frequency of the input signal fed in at said input signal signal to a control electrode of said third active element, and when the frequency of the input signal is low, said capacitance element substantially blocks the input signal from the control electrode of said third active element and enables said third active element to function as a current source to said second active element.

3. The amplifier circuit according to claim 1, further comprising a third resistance element connected to the control electrode of said first active element, wherein a second predetermined voltage is applied to said third resistance element to set an offset potential at said signal output terminal.

4. The amplifier circuit according to claim 2, further comprising:

a fourth resistance element connected in series with said impedance element;

a first series circuit of a capacitance element and a resistance element connected in parallel with said second resistance element;

a second series circuit of a capacitance element and a resistance element connected in series between said first active element and one terminal of a predetermined reference potential; and a third series circuit of a capacitance element and a resistance element connected in series between said third active element and the other terminal of the predetermined reference potential.

5. A display device having amplifier circuits for amplifying red (R), green (G) and blue (B) color signals, respectively, and a cathode-ray tube (CRT) where the R, G and B color signals amplified by said amplifier circuits are fed directly to corresponding cathodes of said CRT, each of said amplifier circuits comprising:

a first active element whose control electrode is supplied with an input signal fed in at an input signal terminal;

a second active element cascade-connected to said first active element and having a control electrode connected to a constant voltage;

a third active element connected to said second active element so that a junction therebetween forms an output of said amplifier circuit;

an impedance element connected between said input signal terminal and said third active element wherein an impedance value thereof changes in accordance with a frequency of the input signal fed in at said input signal terminal;

a first resistance element connected between the junction between said second and third active elements and the control electrode of said first active element; and a second resistance element connected between said input signal terminal and the control electrode of said first active element, and serving to determine a signal amplification factor of said amplifier circuit in cooperation with said first resistance element.

6. The display device according to claims 5, wherein said impedance element is a capacitance element, and when the frequency of the input signal fed in at said input signal terminal is high, said capacitance element supplies the input signal to a control electrode of said third active element, and when the frequency of the input signal is low, said capacitance element substantially blocks the input signal from the control electrode of said third active element and enables said third active element to function as a current source to said second active element.

7. The display device according to claim 5, further comprising:

a fourth resistance element connected in series with said impedance element;

a first series circuit of a capacitance element and a resistance element connected in parallel with said second resistance element;

a second series circuit of a capacitance element and a resistance element connected in series between said first active element and one terminal of a predetermined reference potential; and a third series circuit of a capacitance element and a resistance element connected in series between said third active element and the other terminal of the predetermined reference potential.

* * * * *